United States Patent
Lin et al.

(10) Patent No.: US 11,114,180 B1
(45) Date of Patent: Sep. 7, 2021

(54) NON-VOLATILE MEMORY DEVICE

(71) Applicant: Winbond Electronics Corp., Taichung (TW)

(72) Inventors: Chi-Shun Lin, San Jose, CA (US);
Ngatik Cheung, San Jose, CA (US);
Douk-Hyoun Ryu, San Jose, CA (US);
Ming-Huei Shieh, San Jose, CA (US);
Chuen-Der Lien, San Jose, CA (US)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/994,670

(22) Filed: Aug. 17, 2020

(51) Int. Cl.
| | |
|---|---|
| *G11C 29/42* | (2006.01) |
| *G11C 29/44* | (2006.01) |
| *G11C 7/10* | (2006.01) |
| *G11C 7/22* | (2006.01) |
| *G11C 7/06* | (2006.01) |
| *G11C 29/12* | (2006.01) |

(52) U.S. Cl.
CPC .............. *G11C 29/42* (2013.01); *G11C 7/06* (2013.01); *G11C 7/1012* (2013.01); *G11C 7/222* (2013.01); *G11C 29/44* (2013.01); *G11C 2029/1202* (2013.01)

(58) Field of Classification Search
CPC .......... G11C 29/42; G11C 29/44; G11C 7/06; G11C 7/1012; G11C 7/222; G11C 2029/1202

USPC ............................................. 365/201, 230.06
See application file for complete search history.

(56) References Cited

U.S. PATENT DOCUMENTS

| | | | |
|---|---|---|---|
| 7,996,734 B2 * | 8/2011 | Earle .................. | G06F 11/1048 714/718 |
| 8,064,248 B2 | 11/2011 | Lung | |
| 9,179,020 B2 | 11/2015 | Silverbrook | |
| 10,403,342 B2 | 9/2019 | Luo et al. | |

FOREIGN PATENT DOCUMENTS

| | | |
|---|---|---|
| CN | 101553876 | 10/2009 |
| TW | I408684 | 9/2013 |

* cited by examiner

*Primary Examiner* — Son L Mai
(74) *Attorney, Agent, or Firm* — JCIPRNET

(57) ABSTRACT

A non-volatile memory device includes a first memory cell array, a first error correction code (ECC) decoder and a controller. The first memory cell array is divided into a first sub-array and a second sub-array by a first address boundary. The first ECC decoder is coupled to the first memory cell array, performs an ECC operation on read-out data from first memory cell array. The controller is coupled to the first memory cell array and the first ECC decoder, adjusts the first address boundary according to a first ECC failure bit number.

19 Claims, 4 Drawing Sheets

NON-VOLATILE MEMORY DEVICE

BACKGROUND OF THE INVENTION

1. Field of the Invention

The invention relates to a non-volatile memory device, particularly relates to a hybrid non-volatile memory device.

2. Description of Related Art

With the advancement of electronic technology, an electronic device needs to provide a plurality of service to a user. In conventional art, for satisfying a plurality of demands of the electronic device, there are usually a plurality of individual memory devices disposed in the electronic device. For reducing cost of the electronic device and reducing complexity of design, a non-volatile memory device of single chip can provide hybrid function are requested.

SUMMARY OF THE INVENTION

The invention provides a non-volatile memory device for sharing flexible array.

The non-volatile memory device includes a first memory cell array, a first error correction code (ECC) decoder and a controller. The first memory cell array is divided into a first sub-array and a second sub-array by a first address boundary. The first ECC decoder is coupled to the first memory cell array, performs an ECC operation on read-out data from first memory cell array. The controller is coupled to the first memory cell array and the first ECC decoder, adjusts the first address boundary according to a first ECC failure bit number.

Based on the above, in the embodiments of the invention, an address boundary is generated according to an ECC failure bit number, and the address boundary is used to divide one memory cell array into a first sub-array and a second sub-array. The first sub-array and the second sub-array can be respectively used for storage data and code to achieve hybrid data and code storage macros.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
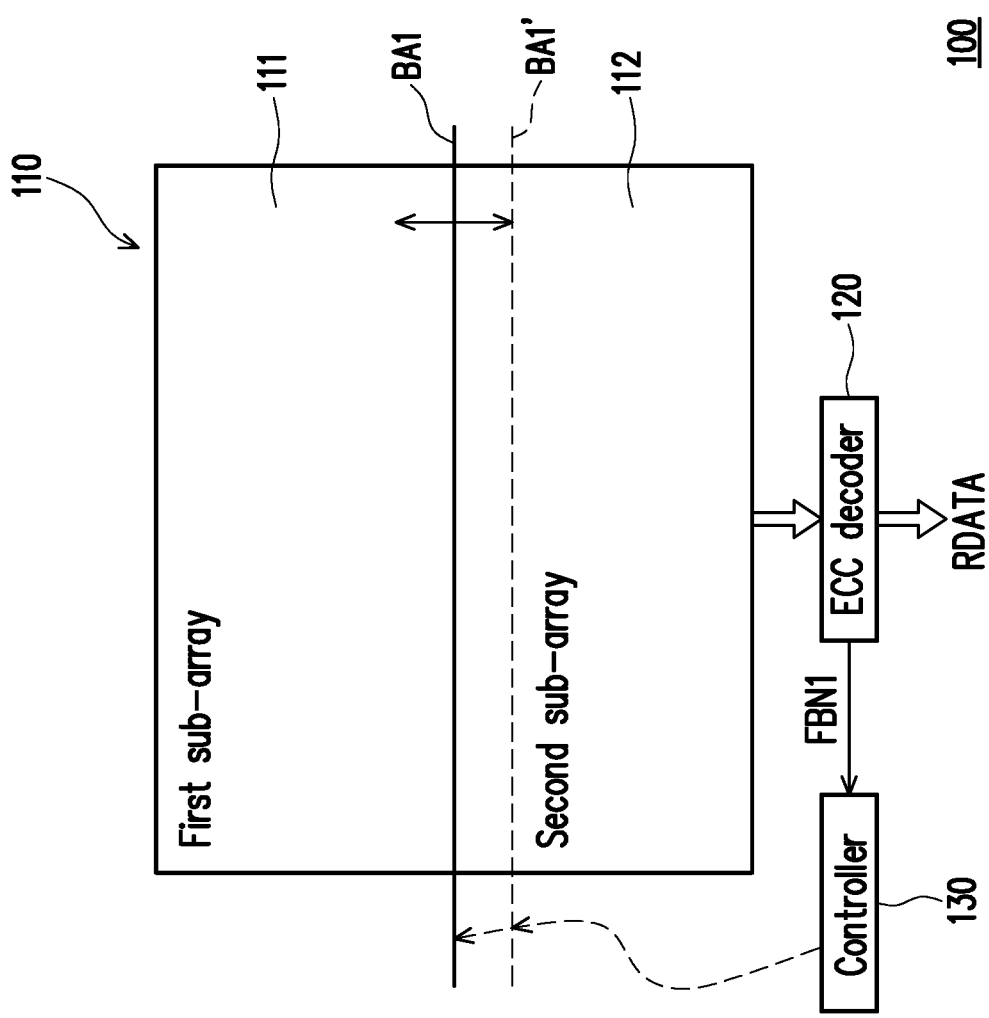
FIG. 1 illustrates a schematic diagram of a non-volatile memory device according to an embodiment of present disclosure.

Reference will now be made in detail to the present preferred embodiments of the disclosure, examples of which are illustrated in the accompanying drawings. Wherever possible, the same reference numbers are used in the drawings and the description to refer to the same or like parts.

Please refer to FIG. 1, which illustrates a schematic diagram of a non-volatile memory device according to an embodiment of present disclosure. The non-volatile memory device 100 includes a memory cell array 110, an error correction code (ECC) decoder 120 and a controller 130. The memory cell array 110 can be divide into a first sub-array 111 and a second sub-array 112 by an address boundary BA1. The ECC decoder 120 is coupled to the memory cell array 110, and is used to perform an ECC operation on a read-out data RDATA from the memory cell array 110. The controller 130 is coupled to the ECC decoder 120 and the memory cell array 110. The controller 130 can obtain an information of an ECC failure bit number FBN1 from the ECC decoder 120, and adjusts the address boundary BA1 according to the ECC failure bit number FBN1.

In this embodiment, the first sub-array 111 may be configured for data storage and the second sub-array 112 may be configured for code storage. In here, the first sub-array 111 is used to store normal data such as information of images, pictures, music or text. The second sub-array 112 is used to store code such as identification codes or boot codes which may be more important than the data stored in the first sub-array 111.

On the other hand, a cycling endurance of cells in the first sub-array 111 may be higher than a cycling endurance of cells in the second sub-array 112. For example, the cycling endurance of cells in the first sub-array 111 may be 1 M-cycles, and the cycling endurance of cells in the second sub-array 112 may be 10 K-cycles. Take each of the cells in the memory cell array 110 is a resistive random access memory (ReRAM) cell as an example. Each of the cells in the second sub-array 112 can be constructed by a one transistor and one resistor (1T1R) structure, and each of the cells in the first sub-array 111 can be constructed by n transistors and n resistors (nTnR) structure, where n is a positive integer larger than 1.

The ECC decoder 120 is used to decode the read-out data RDATA when a read operation is performed. The ECC decoder 120 can obtain the ECC failure bit number FBN1 and transmits the information about the ECC failure bit number FBN1 to the controller 130. The controller 130 can pre-set a predefined number, and compare the ECC failure bit number FBN1 with the predefined number. If the ECC failure bit number FBN1 is larger than the predefined number, the controller 130 can adjust the address boundary BA1 to an adjusted address boundary BA1'.

In this embodiment, when the ECC failure bit number FBN1 is larger than the predefined number, the controller 130 can adjust the address boundary BA1 to the adjusted address boundary BA1' for enlarging a size of the sub-array 111. Such as that, a size of the sub-array 112 is reduced. That is, a reliability of the memory cell array 110 can be extended.

In detail, in present embodiment, when the ECC failure bit number FBN1 being larger than the predefined number is determined, an ability of data retention of memory cells in the first sub-array 111 may be reduced. Such as that, the controller 130 takes some memory cells in the second sub-array 112 to insert into the first sub-array 111 by adjusting the address boundary BA1 to the adjusted address boundary BA1'. Memory cells with a higher data retention ability from the second sub-array 112 can be added into the first sub-array 111 to increase the reliability of the first sub-array 111.

In physical application, the controller 130 may adjust the address boundary BA1 by adjusting a memory mapping table of the non-volatile memory device 100 in one embodiment of present disclosure. Or, the controller 130 may correct a fuse table of the non-volatile memory device 100 in another embodiment of present disclosure. The mapping table and the fuse table may be implemented by hardware structures well known by a person skilled in the art.

It should be noted here, in present embodiment, the non-volatile memory device 100 can provide a read while read function, and also provide a read while write function. While a read operation is performed on the first sub-array 111, another read operation can be performed on the second sub-array 112 and vice versa. Also, while a write operation is performed on the first sub-array 111, a read operation can be performed on the second sub-array 112 and vice versa.

Furthermore, in present embodiment, a write operation on the first sub-array 111 and a second write operation on the second sub-array 112 may be performed with different write algorithms for different reliability and specification requirements. Also, the first sub-array 111 and the second sub-array 112 may respectively adopt a first operation clock signal and a second operation clock signal for accessing operations, wherein a frequency of the first operation clock signal and a frequency of the second operation clock signal may be same or may be different.

In additional, the memory cells in the memory cell array 110 are not limited to the ReRAM cells in present disclosure. The memory cells in the memory cell array 110 may be magnetoresistive random access memory (MRAM) cells, ferroelectric random access memory cells (FRAM), or phase change random access memory (PCRAM) cells, too.

Figure 2:
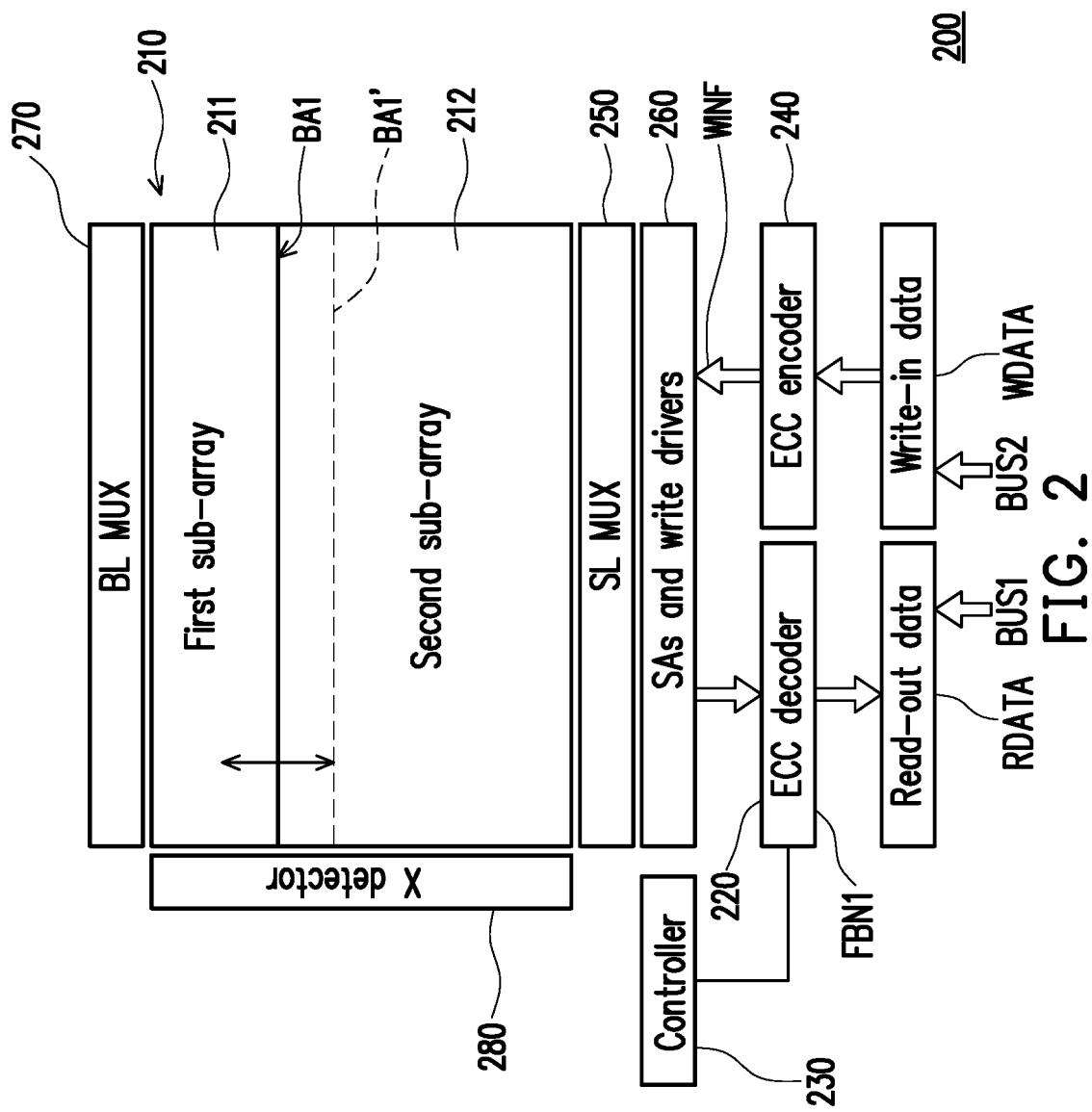
FIG. 2 illustrates a block diagram of a non-volatile memory device according to an embodiment of present disclosure.

Please refer to FIG. 2, which illustrates a block diagram of a non-volatile memory device according to an embodiment of present disclosure. The non-volatile memory device 200 includes a memory cell array 210, an ECC decoder 220, a controller 230, an ECC encoder 240, a source line (SL) multiplexer (MUX) 250, sense amplifiers (SAs) and write drivers 260, a bit line (BL) MUX 270 and a X detector 280.

The memory cell array 210 can be divided into a first sub-array 211 and a second sub-array 212 by an address boundary BA1. Similar to the embodiment in FIG. 1, the address boundary BA1 also can be adjusted by the controller 230. Besides, the first sub-array 211 and the second sub-array 212 are disposed on a same chip.

In this embodiment, the memory cell array 210 is coupled to the SL MUX 250 through a plurality of source lines. The SL MUX 250 is configured to select a plurality of selected source lines among the source lines. The memory cell array 210 is also coupled to the BL MUX 270 through a plurality of bit lines. The BL MUX 270 is configured to select a plurality of selected bit lines among the bit lines. The X detector 280 is coupled to the memory cell array 210 through a plurality of word lines. The X detector 280 is configured to select a detected word line of the memory cell array 210.

The sense amplifiers and write drivers 260 includes a plurality of sense amplifiers and a plurality of write drivers. The sense amplifiers and write drivers 260 is coupled to the SL MUX 250. If a read operation is performed, the sense amplifiers in the sense amplifiers and write drivers 260 may sense data through the selected source line, and a read-out data RDATA can be generated accordingly. If a write operation is performed, the write drivers in the sense amplifiers and write drivers 260 may write a write-in information WINF to first sub-array 211 or the second sub-array 212 through the selected source line.

The ECC decoder 220 is coupled to the sense amplifiers and write drivers 260. When the read operation is performed, the ECC decoder 220 receives a sense out data from the sense amplifiers and write drivers 260, and performs an ECC scheme on the sense out data to generate the read-out data RDATA. Wherein, the sense out data includes a codeword and an ECC code corresponding to the codeword. The ECC decoder 220 can perform the ECC scheme on the codeword according to the ECC code to correct at least one error of the codeword. In this embodiment, the ECC decoder 220 may be a 2 bits ECC decoder or a 3 bits ECC decoder, or any other type decoder known by a person skilled in the art. The ECC scheme performed by the ECC decoder 220 may be Hamming code, BCH code, or any other ECC scheme known by a person skilled in the art.

The ECC encoder 240 is coupled to the sense amplifiers and write drivers 260. The ECC encoder 240 can receive the write-in data WDATA, and perform the ECC scheme on the write-in data WDATA to generate ECC code corresponding to the write-in data WDATA. Furthermore, the ECC encoder 240 transmits a write-in information WINF including the write-in data WDATA and the corresponding ECC code. Such as that, the sense amplifiers and write drivers 260 can write the write-in information WINF to the memory cell array 210 through the selected source lines.

In here, the ECC decoder 220 and the ECC encoder 240 may perform a same ECC scheme for decoding and coding operation.

It should be noted here, in present embodiment, the controller 230 can receives an information about an ECC failure bit number FBN1, and adjust the address boundary BA1 according to the ECC failure bit number FBN1. The controller 230 can compare the ECC failure bit number FBN1 with a predefined number, and activate an adjusting scheme for adjusting the address boundary BA1 when the ECC failure bit number FBN1 larger than predefined number is detected.

In detail, when the ECC failure bit number FBN1 larger than predefined number is detected, the controller 230 can withdraw the original address boundary BA1 and generate an adjusted address boundary BA1'. According to the adjusted address boundary BA1', a size of the first sub-array 210 can be increased and a size of the second sub-array 220 can be decreased correspondingly.

For example, in present embodiment, a cycling endurance of cells in the first sub-array 211 may be 1 M-cycles, and a cycling endurance of cells in the second sub-array 212 may be 10 K-cycles. Take each of the cells in the memory cell array 110 is a resistive random access memory (ReRAM) cell as an example. Each of the cells in the second sub-array 212 can be constructed by a one transistor and one resistor (1T1R) structure, and each of the cells in the first sub-array 211 can be constructed by 2 transistors and 2 resistors (2T2R) structure.

On the other hand, the first sub-array 211 may be coupled to a first data bus BUS1 through the sense amplifiers and write drivers 260, and the second sub-array 212 may be coupled to a second data bus BUS2 through the sense amplifiers and write drivers 260. The first data bus BUS1 and the second data bus BUS2 are both input and output (I/O) bus, and accessing interfaces of the first data bus and the second data bus may be different. For example. each of the first data bus BUS1 and the second data bus BUS2 may be serial peripheral interface (SPI) bus, inner integrated circuit ($I^2C$) bus, a parallel bus or any other bus well known by a person skilled in the art.

In preset embodiment, the first sub-array 211 and the second sub-array 212 respectively adopt a first operation clock signal and a second operation clock signal. In present embodiment, a frequency of the first operation clock signal and a frequency of the second operation clock signal may be different. Besides, a first write operation performed on the first sub-array 211 and a second write operation performed on the second sub-array may be are performed with different write algorithms to meet different reliability and specification requirements, or performed by a same algorithm for the same requirements.

The controller 230 may be implemented by a logic circuit. The logic circuit can be designed by hardware description language (HDL) or any other logic circuit design scheme well known by a person skilled in the art.

Figure 3:
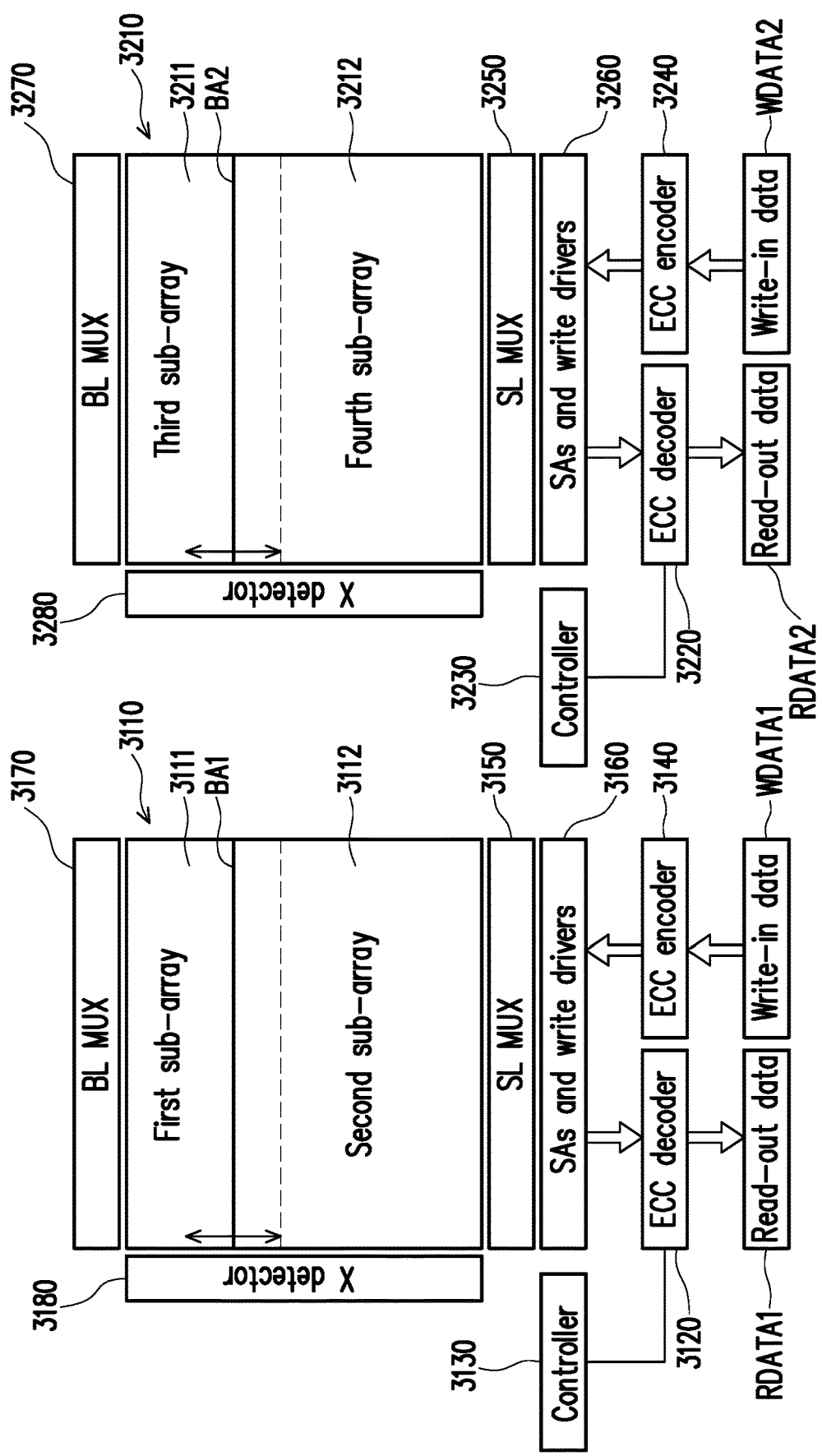
FIG. 3 illustrates a block diagram of a non-volatile memory device according to another embodiment of present disclosure.

Please refer to FIG. 3, which illustrates a block diagram of a non-volatile memory device according to another embodiment of present disclosure. The non-volatile memory device 300 includes memory cell arrays 3110 and 3120, ECC decoders 3120 and 3220, controllers 3130 and 3230, ECC encoders 3140 and 3240, source line (SL) multiplexers (MUX) 3150 and 3250, sense amplifiers (SAs) and write drivers 3160 and 3260, bit line (BL) multiplexers (MUX) 3170 and 3270, and X detectors 3180 and 3280.

The memory cell arrays 3110 and 3120 are disposed on a same chip. The memory cell array 3110 may be divided into a first sub-array 3111 and a second sub-array 3112 by an address boundary BA1, and the memory cell array 3210 may be divided into a third sub-array 3211 and a fourth sub-array 3212 by another address boundary BA2.

The controllers 3130 and 3230 form a controller for the non-volatile memory device 300. The controllers 3130 and 3230 may respectively adjust the address boundary BA1 and BA2 according to ECC failure bit numbers corresponding to the memory cell array 3110 and the memory cell array 3210.

Detail operations for adjusting the address boundaries BA1 and BA2 can be seen in the embodiments mentioned above, and no more repeated description here.

The ECC decoder 3120 is used to generate a read-out data RDATA1 by perform a first ECC decoding operation on sensed out data from the SAs and write drivers 3160. The ECC encoder 3140 performs a first ECC encoding operation on a write-in data WDATA1 to generate a write-in information to the SAs and write drivers 3160. The first ECC decoding operation and the first ECC encoding operation can be based on a same first ECC scheme. Furthermore, The ECC decoder 3220 is used to generate a read-out data RDATA2 by perform a second ECC decoding operation on sensed out data from the SAs and write drivers 3260. The ECC encoder 3240 performs a second ECC encoding operation on a write-in data WDATA2 to generate a write-in information to the SAs and write drivers 3260. The second ECC decoding operation and the second ECC encoding operation also can be based on a same second ECC scheme. Moreover, the first ECC scheme and the second ECC scheme may be same or may be different.

Figure 4:
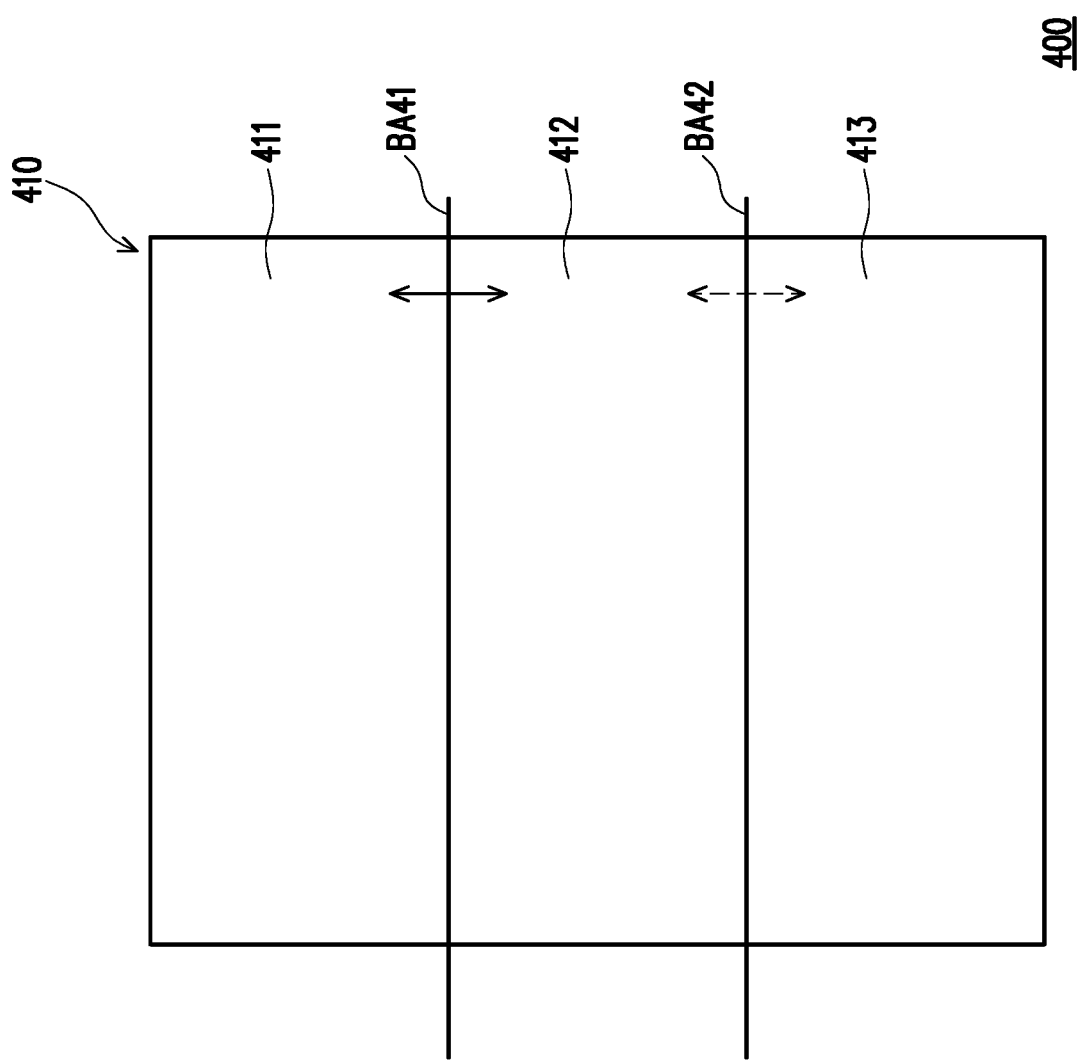
FIG. 4 illustrates a division scheme for a memory cell array according to an embodiment of present disclosure.

Please refer to FIG. 4, which illustrates a division scheme for a memory cell array according to an embodiment of present disclosure. A memory cell array 400 in present embodiment may be divided into 3 or more parts. For example, in FIG. 4, the memory cell array 400 may be divided into a first sub-array 411, a second sub-array 412 and a third sub-array 413 according to a first address boundary BA41 and a second address boundary BA42. In this embodiment, memory cells in the first sub-array 411 may have a first cycling endurance; memory cells in the second sub-array 412 may have a second cycling endurance; and memory cells in the third sub-array 413 may have a third cycling endurance. The first cycling endurance may be larger than the second cycling endurance, and the second cycling endurance may be larger than the third cycling endurance. Take resistive random access memory cell as an example, each of memory cells in the first sub-array 411 may be 3T3R (3 transistors and 3 resistors) structure; each of memory cells in the second sub-array 412 may be 2T2R (2 transistors and 2 resistors) structure; and each of memory cells in the third sub-array 413 may be 1T1R (1 transistor and 1 resistor) structure.

In present embodiment, one of the first address boundary BA41 and the second address boundary BA42 can be adjusted according to an ECC failure bit number of the memory cell array 410. The boundaries adjustment of the first address boundary BA41 and the second address boundary BA42 depends on a reliability data through the device life cycle to meet an optimized bit error rate requirement. Detail operation for adjusting one of the first address boundary BA41 and the second address boundary BA42 can be referred to the embodiments mentioned above, and no more repeated description here.

In summary, the non-volatile memory device of present disclosure provides an adjustable address boundary for dividing a memory cell array to at least two sub-arrays according to an ECC failure bit number. Such as that, a reliability of the memory cell array can be extended.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory device, comprising:
   a first memory cell array, being divided into a first sub-array and a second sub-array by a first address boundary;
   a first error correction code (ECC) decoder, coupled to the first memory cell array, performing an ECC operation on read-out data from the first memory cell array; and
   a controller, coupled to the first memory cell array and the first ECC decoder, adjusting the first address boundary according to a first ECC failure bit number.

2. The non-volatile memory device according to claim 1, wherein the first sub-array is configured for data storage, and the second sub-array is configured for code storage.

3. The non-volatile memory device according to claim 2, wherein a cycling endurance of the first sub-array is higher than a cycling endurance of the second sub-array.

4. The non-volatile memory device according to claim 1, wherein if the first ECC failure bit number is larger than a predefined number, the controller adjusts the first address boundary to an adjusted first address boundary.

5. The non-volatile memory device according to claim 4, wherein the controller adjusts the first address boundary to the adjusted first address boundary for enlarge a size of the first sub-array.

6. The non-volatile memory device according to claim 1, wherein each cell of the second sub-array is constructed by 1T1R structure, and each cell of the first sub-array is constructed by nTnR structure, where n is a positive integer larger than 1.

7. The non-volatile memory device according to claim 1, further comprising:
- a source line multiplexer, coupled to a plurality of source lines of the first memory cell array, selecting a plurality of selected source lines among the source lines;
- sense amplifiers and write drivers, coupled to the source lines and coupled to the first ECC decoder, sensing a read-out data on the selected source lines or transmitting a write-in information to the selected source lines.

8. The non-volatile memory device according to claim 7, further comprising a first ECC encoder, coupled to the sense amplifiers and write drivers, encoding a write-in data to generate the write-in information.

9. The non-volatile memory device according to claim 8, wherein the first ECC decoder and the first ECC encoder perform a same ECC scheme.

10. The non-volatile memory device according to claim 7, further comprising:
- a bit line multiplexer, coupled to a plurality of bit lines of the first memory cell array, selecting a plurality of selected bit lines among the bit lines;
- a X detector, for selecting a detected word line of the first memory cell array.

11. The non-volatile memory device according to claim 7, further comprising a first data bus and a second data bus,
- wherein the first data bus is coupled to the first sub-array through the sense amplifiers and write drivers and the source line multiplexer, and the second data bus is coupled to the second sub-array through the sense amplifiers and write drivers and the source line multiplexer.

12. The non-volatile memory device according to claim 11, wherein accessing interfaces of the first data bus and the second data bus are different.

13. The non-volatile memory device according to claim 11, wherein each of the first data bus and the second data bus is serial peripheral interface (SPI) bus, inner integrated circuit ($I^2C$) bus or a parallel bus.

14. The non-volatile memory device according to claim 1, wherein if a read operation is performed on one of the first sub-array and the second sub-array, another read operation can be performed on another one of the first sub-array and the second sub-array.

15. The non-volatile memory device according to claim 1, wherein if a write operation is performed on one of the first sub-array and the second sub-array, a read operation can be performed on another one of the first sub-array and the second sub-array.

16. The non-volatile memory device according to claim 1, wherein the first sub-array and the second sub-array respectively adopt a first operation clock signal and a second operation clock signal, wherein a frequency of the first operation clock signal and a frequency of the second operation clock signal are different.

17. The non-volatile memory device according to claim 1, wherein a first write operation on the first sub-array and a second write operation on the second sub-array are performed with different write algorithms.

18. The non-volatile memory device according to claim 1, wherein cells of the first memory cell array are magnetoresistive random access memory (MRAM) cells, ferroelectric random access memory cells (FRAM), resistive random-access memory (ReRAM) cells or phase change random access memory (PCRAM) cells.

19. The non-volatile memory device according to claim 1, further comprising:
- a second memory cell array, being divided into a third sub-array and a fourth sub-array by a second address boundary;
- a second error correction code (ECC) decoder, coupled to the second memory cell array, performing the ECC operation on read-out data from second memory cell array,
- wherein the controller further coupled to the second memory cell array and the second ECC decoder and adjusting the second address boundary according to an second ECC failure bit number.

* * * * *